(12) United States Patent
Ibok

(10) Patent No.: US 6,180,466 B1
(45) Date of Patent: *Jan. 30, 2001

(54) ISOTROPIC ASSISTED DUAL TRENCH ETCH

(75) Inventor: Effiong E. Ibok, Sunnyvale, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/992,843

(22) Filed: Dec. 18, 1997

(51) Int. Cl.[7] ............... H01L 21/336; H01L 21/76; H01L 21/302; H01L 21/461
(52) U.S. Cl. ............... 438/296; 438/424; 438/704
(58) Field of Search ................. 438/296, 424, 438/704

(56) References Cited

U.S. PATENT DOCUMENTS

| | | | |
|---|---|---|---|
| 4,889,827 | * | 12/1989 | Willer . |
| 5,108,939 | * | 4/1992 | Manley et al. . |
| 5,132,241 | * | 7/1992 | Su . |
| 5,258,332 | * | 11/1993 | Horioka et al. . |
| 5,683,908 | * | 11/1997 | Miyashita et al. . |
| 5,863,827 | * | 1/1999 | Joyner . |
| 5,911,109 | * | 6/1999 | Razouk et al. . |

FOREIGN PATENT DOCUMENTS

404303942 * 10/1992 (JP) .

OTHER PUBLICATIONS

Ghandi, Sorab K., VLSI Fabrication Principles, John Wiley & Sons, p.649, 1994.*
Wolf, S. and Tauber, R.N., Silicon Processing for the VLSI Era, vol. I, Lattice Press, p. 210, 1986.*

* cited by examiner

Primary Examiner—John F. Niebling
Assistant Examiner—Josetta I. Jones

(57) ABSTRACT

A shallow trench isolation structure having rounded corners is formed at edge-rounding oxidation temperatures employing a two-step trench etching technique. Isotropic etching is first performed, undercutting a pad oxide layer and a barrier nitride layer. Subsequently, anisotropic etching is conducted to form the remainder of the trench. The isotropic etch enables the thermal oxidation to form an oxide liner with rounded edges and reduced stress at relatively low temperatures, e.g. 900° C. or less, even using water vapor as the oxidizing species.

41 Claims, 3 Drawing Sheets

ISOTROPIC ASSISTED DUAL TRENCH ETCH

TECHNICAL FIELD

The present invention relates to manufacturing semiconductor devices with trench isolation and, more particularly, to manufacturing ultra large scale integration and high density semiconductor devices with submicron design features and active regions isolated by shallow insulated trenches.

BACKGROUND ART

Escalating demands for high density and performance associated with ultra large scale integration require semiconductor devices with design features of 0.25 microns and under, e.g. 0.18 microns, increased transistor and circuit speeds, high reliability, and increased manufacturing throughput. The reduction of design features to 0.25 microns and under challenges the limitations of conventional semiconductor technology for isolating active regions.

Conventional semiconductor devices comprise a substrate having various electrically isolated regions, called active regions, in which individual circuit components are formed. The active region typically includes source/drain regions of a transistor formed in the semiconductor substrate or epitaxial layer, spaced apart by a channel region. A gate electrode for switching the transistor is formed on the channel with a gate oxide layer therebetween. The quality and thickness of the gate oxide are crucial to performance and device reliability.

The electrical isolation of active regions is typically accomplished by defining field regions bounding the active regions, defined by a source/drain mask applied to a barrier nitride layer deposited over the semiconductor substrate, typically doped monocrystalline silicon or an epitaxial layer formed thereon. An isolating field oxide regions is typically formed by thermal oxidation of semiconductor substrate.

One type of isolation is known as Local Oxidation Of Silicon (LOCOS), in which the entirety of the field oxide is formed by heating the substrate with the field regions exposed to an oxidizing gas, such as oxygen or water vapor. LOCOS methodology, however, disadvantageously results in the formation of a field oxide region having tapering edges, because the oxidizing species for forming the field oxide diffuses horizontally after penetrating the substrate. This tapering end portion resembles and, therefore, is commonly referred to as, a "bird's beak."

LOCOS methodology is thus subject to several inherent problems. For example, while the horizontal extent of the bird's beak can be loosely controlled by the stress induced in the masking layers adjacent to the field, this same stress can cause strain defects in the active areas including point defects, dislocations, stacking faults, as well as catastrophic failures such as delamination, particle generation, etc. Moreover, aggressive scaling of gate electrode dimension into the deep submicron regime, such as less than about 0.25 microns, requires tighter source/drain region to source/drain region spacing, which is adversely affected by the bird's beak attendant upon LOCOS methodology.

Another type of isolation is known as shallow trench isolation (STI). This form of isolation is typically accomplished by etching a trench in the substrate, conducting a thermal oxidation step to grow an oxide liner on the trench walls to control the silicon-silicon dioxide interface quality, and filling the lined trench with an insulating material, such as silicon dioxide derived from tetraethyl orthosilicate (TEOS). The surface is then planarized, as by chemical-mechanical polishing (CMP), to complete the trench isolation structure. A typical trench isolation structure thus comprises an internal surface with side surfaces extending into the substrate (or epitaxial layer) with edges at the main surface of the substrate and at the bottom of the trench.

A difficulty with trench isolation is that the sharp top corners of the trench, e.g. from about 90° to about 110°, induce stress, which is transmitted to the active regions of the substrate, resulting in degradation of the quality of the gate oxide and, hence, adversely affecting device performance and reliability. A conventional approach to this problem involves growing the oxide liner at a high enough (dry) oxidation temperature, e.g. about 950° C. and above typically at 1100° C., to cause the top corners of the trench to become rounded, thereby reducing the induced stress.

As feature sizes, e.g. isolation trenches, shrink to 0.25 microns and below, such as 0.18 microns, it becomes increasingly difficult to define reliable trench isolation structures. For example, the side-walls of the trench tend to expand inwardly and vertically align during edge-rounding oxidation. This condition, termed "reentrance," disadvantageously induces stress at the side-walls of the trench, which is transmitted to the active regions. With smaller feature sizes, especially in the deep submicron regime such as 0.18 microns, reentrance is exacerbated since greater aspect ratios result in greater vertical alignment of the side-walls during edge-rounding oxidation.

In addition, conducting edge-rounding oxidation at about 950° C. is costly in terms of time, e.g. a period of about two to three hours, undesirably reducing production throughput. A conventional approach for improving production throughput involves raising the temperature of the edge-rounding oxidation, typically to about 1,100° C., wherein sufficient edge rounding may take place in about twenty minutes. Edge-rounding oxidation at such high temperatures, however, causes other difficulties such as "slip" of the trench surface, which is the dislocation of crystal planes exposed when the trench opening is etched. Slip is a major factor of stress transmitted to the active regions, causing degradation of the gate oxide quality over the active regions, thereby adversely affecting device performance.

Attempts to enhance production throughput by other conventional means as, for example, by employing water vapor as the oxidizing species (wet oxidation) instead of molecular oxygen (dry oxidation), have generally been found to greatly aggravate the stress problems due to reentrance and slip.

DISCLOSURE OF THE INVENTION

There exists a continuing need for a shallow trench isolation methodology wherein the resulting gate oxide layer at the trench edges exhibits high reliability. There is a need for reducing the stress induced at the corners and side walls of the isolation trenches, especially for deep submicron geometries.

A need also exists for improving the throughput in rounding the top edges of the isolation trench without inducing additional stresses due to, e.g. , reentrance and slip.

These and other needs are met by the present invention, in which the top corners of the isolation trench are anisotropically etched before performing the edge-rounding oxidation to produce a liner oxide with rounded corners. Consequently, the edge-rounding liner oxidation step can be performed at significantly lower temperatures, e.g. about 800° C. to 900° C., avoiding the additional stresses induced by conventional methods. Furthermore, the lower temperatures enable the use of wet oxidation without the attendant disadvantages of reentrance and slip.

Accordingly, one aspect of the invention is method of manufacturing a semiconductor device having an active region isolated by an insulated trench, comprising: forming a pad oxide on a main surface of a semiconductor substrate or an epitaxial layer formed on a semiconductor substrate; forming a nitride layer on the pad oxide layer; etching to remove selected portions of the nitride layer and to form an opening therein having side surfaces; removing portions of the pad oxide layer beneath the opening in the nitride layer; isotropically etching: to remove portions of the semiconductor substrate or the epitaxial layer beneath the opening in the nitride layer; and to undercut the pad oxide beneath the nitride layer, thereby exposing a portion of the substrate or the epitaxial layer beneath the nitride layer; anisotropically etching to remove portions of the semiconductor substrate or the epitaxial layer to form a trench opening having an internal surface and vertically sloping sides; and forming a thin oxide liner at the internal surface of the trench opening, at the vertically sloping sides, and at the exposed portion of the substrate or the epitaxial layer.

In accordance with another aspect of the invention, a method of manufacturing a semiconductor device having an active region isolated by an insulated trench comprises: forming a trench opening having an internal surface with side surfaces and edges, wherein the side surfaces are vertically sloped; and forming an oxide liner on the internal surface by oxidation by heating at a temperature of about 900° C. or less. The trench edges are rounded during the heating and the oxide liner is formed on the trench edges with a rounded configuration and a thickness that is no less than the thickness of the oxide liner at any other location on the internal surface of the trench.

Still another aspect of the invention is method of manufacturing a semiconductor device having an active region isolated by an insulated trench, comprising: forming a trench opening having an internal surface with side surfaces and edges, wherein the side surfaces are vertically sloped; and forming an oxide liner on the internal surface by oxidation with water vapor as an oxidizing species. The trench edges are rounded during the heating and the oxide liner is formed on the trench edges with a rounded configuration and a thickness that is no less than the thickness of the oxide liner at any other location on the internal surface of the trench.

In accordance with yet another aspect of the invention, a method of manufacturing a semiconductor device having an active region isolated by an insulated trench comprises: forming a silicon oxide pad layer on a main surface of a semiconductor substrate or an epitaxial layer formed on a semiconductor substrate; forming a silicon nitride layer on the pad oxide layer; providing a photoresist mask on the silicon nitride layer; etching to remove portions of the nitride layer and to form an opening therein having sides; removing portions of the pad oxide layer beneath the opening in the nitride layer; isotropically etching in a sulfur hexafluoride plasma with a power of 100 watts or less: to remove portions of the semiconductor substrate or the epitaxial layer to a depth of about 200 Å beneath the opening in the nitride layer; and to undercut the nitride layer, thereby exposing a portion of the substrate or the epitaxial layer beneath the nitride layer; anisotropically etching in a chlorine plasma with a power of about 600 watts to about 800 watts at a pressure of about 0.2 Torr or less to remove portions of the semiconductor substrate or the epitaxial layer to form a trench opening having an internal surface and vertically sloping sides; and forming a thin oxide liner by oxidation by heating to a temperature of about 900° C. or less at the internal surface of the trench opening, at the vertically sloping sides, and at the exposed portion of the substrate or the epitaxial layer.

BEST MODE FOR CARRYING OUT THE INVENTION

The present invention addresses and solves problems associated with relieving stress induced at the top corners of an isolation trench, without inducing additional stresses due to reentrance of the side walls or slip of the bottom corners of the trench, as by elevating the edge-rounding oxidation temperature or employing wet oxidation. If fact, the present invention enables effective edge-rounding liner oxidation step at temperatures significantly lower than conventionally employed, e.g. at about 800° C. to about 900° C., while avoiding the additional stresses induced by conventional methods and approaches. Thus, the lower temperatures enable the use of wet oxidation without the attendant disadvantages of reentrance and slip.

In accordance with the present invention, the top corners of the isolation trench are anisotropically etched before edge-rounding oxidation to produce a liner oxide with rounded corners. Specifically, portions of the semiconductor substrate or epitaxial layer are removed to undercut a portion of the pad oxide beneath the barrier nitride layer near the trench opening exposing a section of the substrate or epitaxial layer. The isotropic etching at the top of the trench creates top corners at a more oblique angle relative to the sidewall of the trench, e.g. closer to about 135° in the range of about 120° to about 160°, with respect to conventional isolation trenches in the 90° to 110° range. Corners with a more oblique corner angle cause less stress and are more easily rounded in the subsequent edge-rounding liner oxidation step. Therefore, edge-rounding oxidation can be carried out at a lower temperature, for example, less than about 900° C. such as about 850° C., even as low as about 800° C. At such low temperatures, the trench oxide liner can be formed effectively by wet oxidation without creating additional stress as in conventional approaches, at oxidation times of as low as about 10 minutes to 25 minutes.

Furthermore, undercutting a portion of the barrier nitride layer exposes the trench edges where the crystallographic orientation is [111], on which oxide growth is faster than in horizontal portions of the substrate having a [100] crystallographic orientation or on a vertical portion of the substrate having a [110] crystallographic orientation. It is believed that the exposed section of the main surface proximate the trench edges oxidizes faster than an oxide covered surface, thereby consuming a portion of and rounding the trench edges, with an attendant rounding of the gate oxide/liner formed thereon.

Figure 1A:
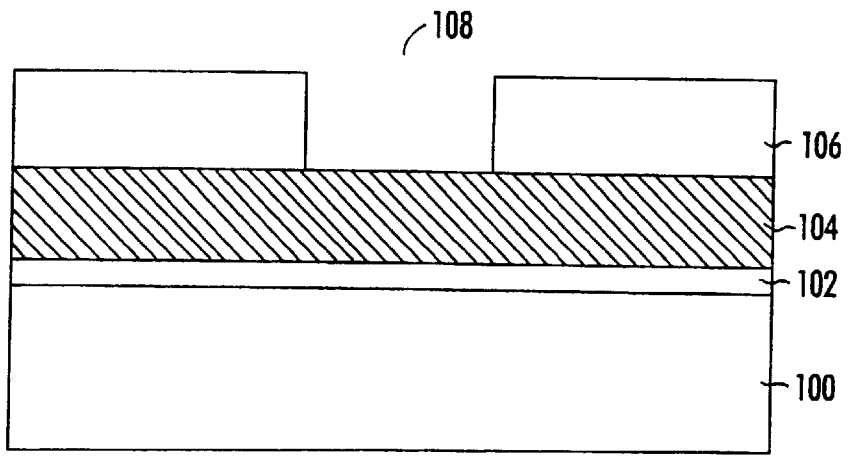
FIGS. 1A to 1I represent sequential phases of a method in accordance with an embodiment of the present invention.

An embodiment of the present invention is schematically illustrated in FIGS. 1A through 1I, wherein similar elements bear like reference numerals. Referring to FIG. 1A, a substrate 100 is prepared, typically a semiconductor substrate comprising doped monocrystalline silicon or an epitaxial layer formed on a silicon substrate in accordance with conventional practices. A pad oxide layer 102 is then formed on substrate 100. Pad oxide layer 102 typically comprises silicon oxide and can be thermally grown on the substrate or deposited by chemical vapor deposition (CVD). In another embodiment, a pad oxide containing a thinned thermally-grown silicon oxide layer and a buffer polycrystalline silicon layer is employed as the pad layer.

Subsequently, a nitride layer 104 is deposited on silicon oxide pad layer 102, such as a silicon nitride layer by CVD. Silicon oxide pad layer 102 functions as a buffer layer, cushioning stresses between substrate 100 and silicon nitride layer 104. Silicon nitride layer 104 functions as an oxidation mask because it is resistant to the diffusion of oxygen and water vapor therethrough, thereby preventing an oxidizing species from reaching the underlying silicon substrate. A photoresist mask 106 is formed upon the deposited silicon nitride layer 104 having a pattern defined, e.g., by opening 108, typically having a width substantially corresponding to the width of the subsequently formed trench, such as less than about 0.375 micron, e.g., less than about 0.25 micron.

Figure 1B:
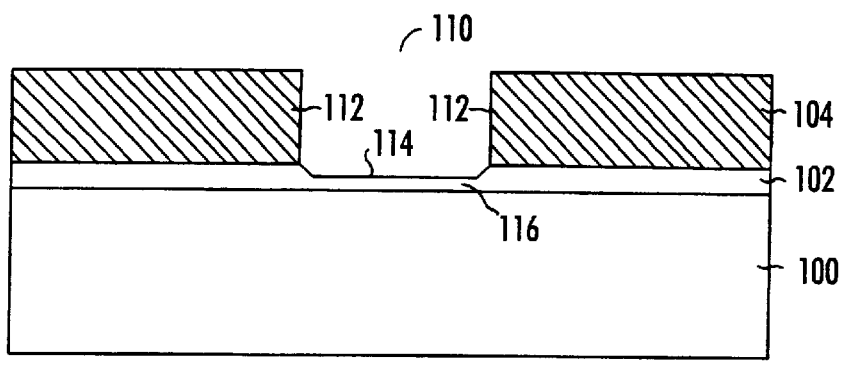

Referring to FIG. 1B, the barrier nitride is etched to form an opening 110, typically having a width substantially corresponding to the width of opening 108 in photoresist mask 106. The opening 110 has an internal surface defined, in part, by silicon nitride layer side surfaces 112 and bottom surface 114 in pad oxide layer 102. Photoresist 106 is then stripped. According to an embodiment of the present invention, illustrated in FIG. 1B, the etching of the opening 110 in the barrier nitride layer 104 stops at or is slightly within the pad oxide layer 102, leaving a portion 116 of the pad oxide layer 102 remaining on the substrate 100 within the opening 110. In such an embodiment, the remaining portions of the pad oxide layer 130 within the opening 110 will be removed during the etching to form spacers, as described in more detail hereinafter. Alternatively, the etching to pattern the barrier nitride layer 104 may be continued removing all of pad oxide layer 102 located within the opening 110 until the substrate 100 is reached. In yet another embodiment, pad oxide layer 102 may be partially etched, followed by dipping in an aqueous hydrofluoric (HF) acid solution, e.g. 10 water: 1 HF, to clean off the remaining the pad oxide in the opening 110.

As described in more detail hereinafter, during isotropic etching of the substrate 100 to form the top corners of the isolation trench, portions of the barrier nitride layer 104 are removed, thereby enlarging the width of the isolation trench and reducing the available area in the active regions. Accordingly, in a preferred embodiment of the present invention, oxide spacers are formed to protect the side surfaces 112 of the opening 110 in the barrier nitride layer 104.

Figure 1C:
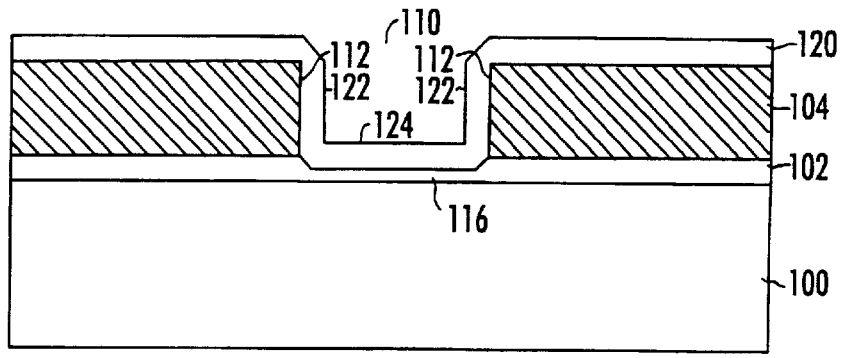
Figure 1D:
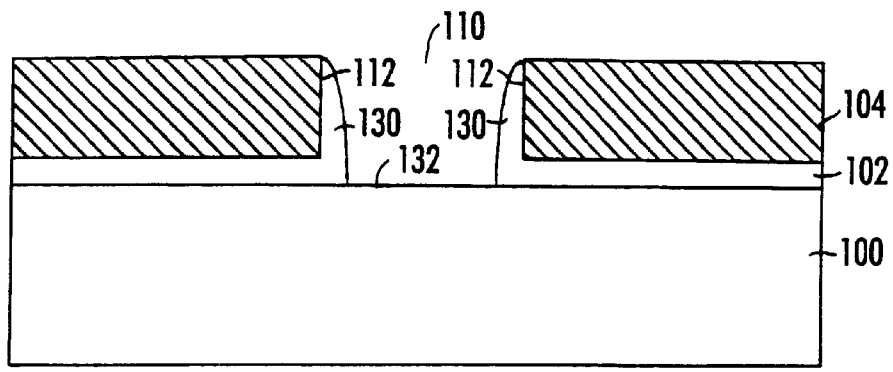

Referring to FIG. 1C, an oxide layer 120 is deposited, as by chemical vapor deposition (CVD), low pressure CVD (LPCVD), or plasma enhanced CVD (PECVD) techniques, over the barrier nitride layer 104, within the opening 110, and covering the side surfaces 112 of the barrier nitride layer 104 at the opening 110. Oxide layer 120 is formed at a suitable a thickness, e.f. at a thickness of about 200 Å to 500 Å. Subsequently, as shown in FIG. 1D, an anisotropic etching is conducted to remove most of oxide layer 120, leaving oxide sidewall spacers 130 on the sides 112 of the opening 110 in the barrier nitride layer 104, which may have a thickness of about 50 Å to 250 Å, such as 200 Å. During anisotropic etching to form the sidewall spacers, remaining portions 116 of the pad oxide layer 102 are removed, exposing a section 132 of the main surface of substrate 100.

Figure 1E:
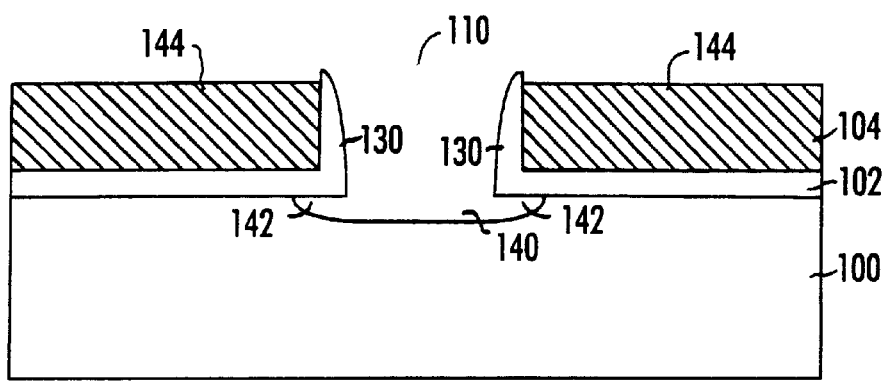

Referring to FIG. 1E, after exposing section 132, isotropic etching is carried out. In an embodiment, a low-power helium-sulfur hexafluoride (He-$SF_6$) plasma chemistry is employed to isotropically etch a portion 140 of the substrate 100 to a depth of about 200 Å and form an undercut 142 of the oxide spacers 130, if present, and the pad oxide 102 underlying the barrier nitride layer 104 by about 200 Å. The appropriate parameters for the isotropic etch can be optimized in a particular situation. For example, suitable isotropic etching parameters include a power of 100 watts or less, a fixed flow rate for $SF_6$ of 50 sccm or less, a fixed flow rate for He of 100 sccm or less, and a pressure of 1 Torr or less.

During isotropic etching, a portion of the barrier nitride layer 104 may be removed, hence, resulting in a recessed top surface 144. Thus, the presence of oxide spacers 130 protects the side surfaces 112 of the barrier nitride layer 104 in the opening 110 from erosion and, hence, reduces the operative size of the proximate active regions.

Figure 1F:
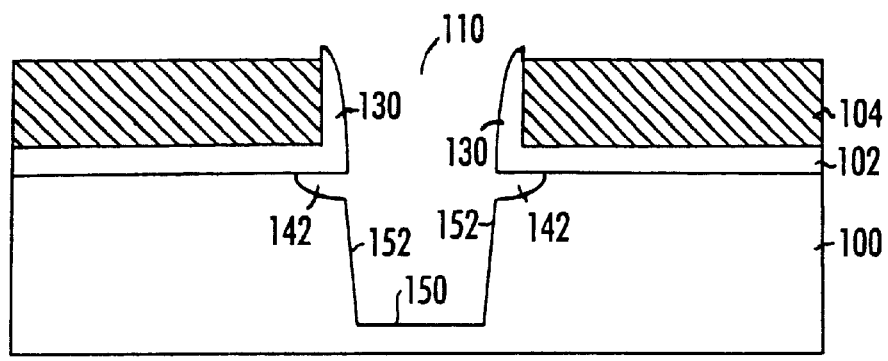

Referring to FIG. 1F, anisotropic etching is conducted to form trench 150 by removing portions of substrate 100 beneath the opening 110. Trench 150 has an internal surface defined, in part, by side surfaces 152 which are vertically sloped, e.g. at an angle of about 70° to about 75°. Trench 110 can be etched to a depth of about 2,000 Å to about 4,000 Å. For example, a depth such as about 3,000 Å has been found to be particularly suitable. Undercut areas 142 from the isotropic etch serve to reduce the sharpness of the top corner of the trench 150 and provide more suitably oriented silicon crystal planes for the subsequent edge-rounding liner oxidation.

In an embodiment of the present invention, a high-power, low-pressure helium-chlorine (He-$Cl_2$) plasma chemistry is employed to etch the trench 150 within substrate 100. In alternative embodiments, other chemistries, such as a helium bromide (HBr) chemistry, may be employed. Appropriate anisotropic etch parameters can readily be determined for a particular situation. For example, suitable anisotropic etching parameters include a power of about 600 watts to about 800 watts, a fixed flow rate for $Cl_2$ of 60 sccm or less, a fixed flow rate for He of 100 sccm or less, and a pressure of 0.2 Torr or less.

Figure 1G:
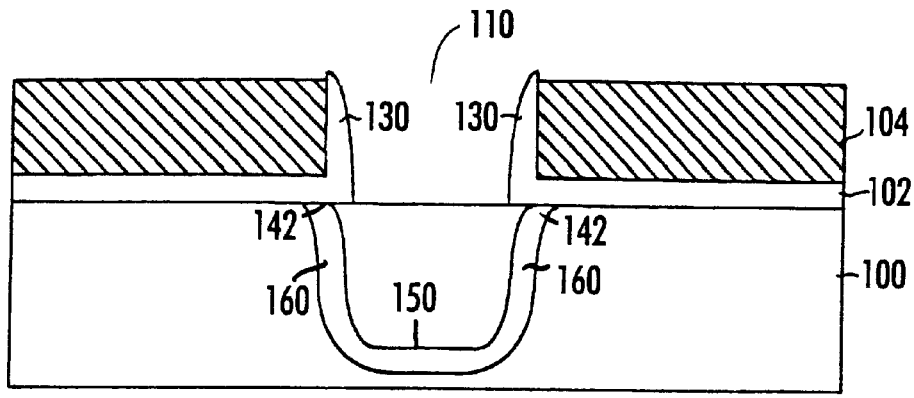

Referring to FIG. 1G, an oxide liner 160 is formed by thermal oxidation, during which the trench edges are consumed and, hence, rounded. The oxide liner 160 formed on the trench edges is also rounded and has a thickness no less than the thickness of the oxide liner at the other portions in the trench. The thermal oxide 160 grown in the undercut region 142 in proximity to the trench edges is of a high quality providing excellent electrical isolation between the active device area and the trench isolation. The oxide liner 160 may be grown to a thickness of about 500 Å.

Since undercut regions 142 are provided by isotropic etching of a portion of the substrate 100, edge-rounding liner oxidation can be effective at temperatures lower than conventional practices and approaches, e.g., at a temperature of about 900° C. or less, such as about 800° C. to about 850° C. In fact, edge-rounding liner oxidation can be effectively conducted using water vapor as the oxidizing species at a temperature of about 850° C. for a period of time sufficient to achieve a thickness of about 500 Å or less, without introducing substantial stress into the active regions. Compared to edge-rounding temperatures of about 950° C. to about 1100° C., the present invention results in less stress imposed on the side surfaces of the trench, less slippage at the bottom corners, and enhanced oxide quality, for improved electrical characteristics.

Figure 1H:
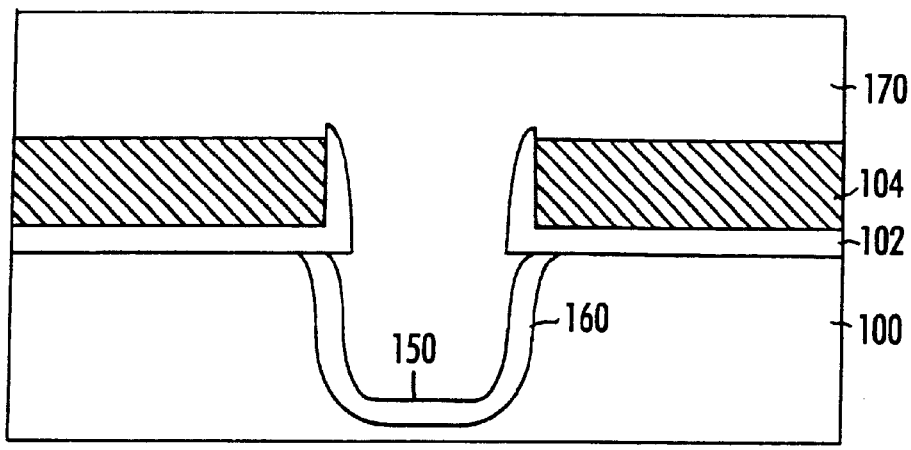
Figure 1I:
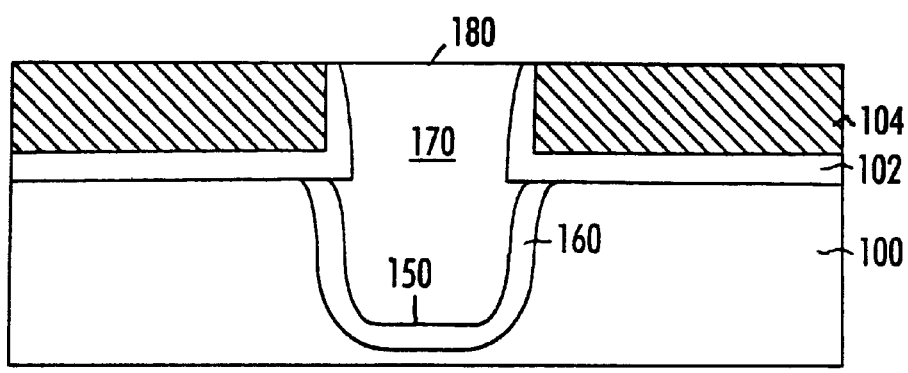

The trench isolation structure is completed by filling the trench 150 with a suitable insulation material 170, as illustrated in FIG. 1H. Such insulating material can comprise silicon dioxide derived from TEOS by LPCVD or derived from silane by LPCVD. Alternatively, the trench can be filled with a high density plasma (HDP) oxide, employing the methodology disclosed in the commonly-assigned, copending application Ser. No. 08/924,133, filed Sep. 5, 1997. Referring to FIG. 1I, subsequent to trench filling, planarization is effected resulting in a substantially flat surface 180.

The present invention can be practiced by employing conventional materials, methodology and equipment. Accordingly, the details of such materials, equipment and methodology are not set forth herein in detail. The present invention is applicable to the production of various types of semiconductor devices, and enjoys particular utility in the production of semiconductor devices having a design rule less than about 0.25 micron, including less than about 0.18 micron.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having an active region isolated by an insulated trench, said method comprising:

forming a pad oxide on a main surface of a semiconductor substrate or an epitaxial layer formed on a semiconductor substrate;

forming a nitride layer on the pad oxide layer;

etching to remove selected portions of the nitride layer and to form an opening therein having side surfaces;

depositing an insulating layer to cover the sides of the nitride layer;

etching to form spacers protecting the side surfaces of the opening in the nitride layer and to remove portions of the pad oxide layer beneath the opening in the nitride layer;

isotropically etching: to remove portions of the semiconductor substrate or the epitaxial layer beneath the opening in the nitride layer; and to undercut the pad oxide layer beneath nitride layer, thereby exposing a portion of the substrate or the epitaxial layer beneath the nitride layer;

anisotropically etching to remove portions of the semiconductor substrate or the epitaxial layer to form a trench opening having an internal surface and vertically sloping sides; and forming a thin oxide liner at the internal surface of the trench opening, at the vertically sloping sides, and at the exposed portion of the substrate or the epitaxial layer using the barrier nitride layer as an oxidation mask.

2. The method of according to claim 1, wherein the pad oxide layer comprises silicon oxide and the nitride layer comprises silicon nitride.

3. The method of claim 1, comprising providing a mask on the nitride layer to define the selected portions of the nitride layer to be removed.

4. The method of claim 3, wherein the mask comprises a photoresist mask.

5. The method of claim 3, wherein the portions of the pad oxide layer are removed during the etching of the nitride layer.

6. The method of claim 1, wherein the spacers are removed by dipping in an aqueous hydrofluoric acid solution.

7. The method of claim 1, wherein the substrate or the epitaxial layer is isotropically etched to a depth of about 200 Å.

8. The method of claim 7, wherein the substrate or the epitaxial layer is isotropically etched in a sulfur hexafluoride ($SF_6$) plasma.

9. The method of claim 8, wherein the substrate or the epitaxial layer is isotropically etched while feeding sulfur hexafluoride at a rate of about 50 sccm and helium at a rate of about 100 sccm.

10. The method of claim 8, comprising isotropically etching the substrate or epitaxial layer at a power of about 100 watts or less.

11. The method of claim 1, comprising anisotropically etching the trench opening in a chlorine or bromine plasma.

12. The method of claim 11, comprising anisotropically etching the trench opening at a power of about 800 watts or less.

13. The method of claim 12, comprising anisotropically etching the trench opening at a power of about 600 watts.

14. The method of claim 12, comprising anisotropically etching the trench opening while feeding chlorine at 60 sccm and helium at 100 sccm.

15. The method of claim 14, comprising anisotropically etching the trench opening at a pressure of about 0.2 Torr or less.

16. The method of claim 1, comprising oxidizing to form the thin oxide liner.

17. The method of claim 16, comprising oxidizing to form the thin oxide liner at a temperature of about 900° C. or less.

18. The method of claim 17, comprising oxidizing to form the thin oxide liner at a temperature of about 800° C. to about 850° C.

19. The method of claim 16, comprising oxidizing to form the thin oxide liner using water vapor as an oxidizing species.

20. The method of claim 1, comprising filling the lined trench opening with an insulating material.

21. The method of claim 20, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

22. The method of claim 21, comprising planarizing the insulating trench by chemical-mechanical polishing.

23. A method of manufacturing a semiconductor device having an active region isolated by an insulated trench formed in a semiconductor substrate or an epitaxial layer formed on a semiconductor substrate, said method comprising:

isotropically etching: to remove portions of the semiconductor substrate or the epitaxial layer and to undercut a pad oxide layer;

anisotropically etching to remove portions of the semiconductor substrate or the epitaxial layer to form a trench opening having an internal surface with side surfaces and edges, wherein the side surfaces are vertically sloped; and rounding the trench edges by oxidation by heating at a temperature of about 850° C. or less with water vapor as an oxidizing species, wherein an oxide liner is formed on the trench edges with a rounded configuration and a thickness no less than the thickness of the oxide liner at any other location on the internal surface of the trench.

24. The method of claim 23, wherein the oxidation is performed for about twenty minutes or less.

25. The method of claim 23, wherein the thin oxide liner is formed by oxidation at a temperature of about 800° C. to about 850° C.

26. The method of claim 23, comprising:

forming a pad oxide on a main surface of a semiconductor substrate or an epitaxial layer formed on a semiconductor substrate;

forming a nitride layer on the pad oxide layer;

etching to remove selected portions of the nitride layer and to form an opening therein having side surfaces;

removing portions of the pad oxide layer beneath the opening in the nitride layer;

isotropically etching: to remove portions of the semiconductor substrate or the epitaxial layer beneath the opening in the nitride layer; and to undercut the pad oxide layer beneath the nitride layer, thereby exposing a portion of the substrate or the epitaxial layer beneath the nitride layer;

anisotropically etching to remove portions of the semiconductor substrate or the epitaxial layer to form a trench opening having an internal surface and vertically sloping sides; and forming the oxide liner on the internal surface of the trench opening, at the vertically sloping sides, and on the exposed portion of the substrate or the epitaxial layer.

27. The method of claim 26, comprising isotropically etching the substrate or the epitaxial layer to a depth of about 200 Å.

28. The method of claim 27, comprising isotropically etching the substrate or the epitaxial layer in a sulfur hexafluoride ($SF_6$) plasma.

29. The method of claim 28, comprising isotropically etching the substrate or the epitaxial layer while feeding sulfur hexafluoride at a rate of about 50 sccm and helium at a rate of about 100 sccm.

30. The method of claim 28, comprising isotropically etching the substrate or the epitaxial layer at a power of about 100 watts or less.

31. The method of claim 26, comprising anisotropically etching the trench opening in a chlorine or bromine plasma.

32. The method of claim 31, comprising anisotropically etching the trench opening at a power of about 800 watts or less.

33. The method of claim 32, comprising anisotropically etching the trench opening at a power of about 600 watts.

34. The method of claim 32, comprising anisotropically etching the trench opening while feeding chlorine at 60 sccm and helium at 100 sccm.

35. The method of claim 34, comprising anisotropically etching the trench opening at a pressure of about 0.2 Torr or less.

36. The method of claim 32, comprising filling the lined trench opening with an insulating material.

37. The method of claim 36, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

38. The method of claim 37, comprising planarizing the insulating trench by chemical-mechanical polishing.

39. A method of manufacturing a semiconductor device having an active region isolated by an insulated trench, said method comprising:

forming a silicon oxide pad layer on a main surface of a semiconductor substrate or an epitaxial layer formed on a semiconductor substrate;

forming a silicon nitride layer on the pad oxide layer;

providing a photoresist mask on the silicon nitride layer;

etching to remove portions of the nitride layer and to form an opening therein having sides;

depositing an insulating layer to cover the sides of the nitride layer;

etching to form spacers protecting the sides of the nitride layer and to remove portions of the pad oxide layer beneath the opening in the nitride layer;

isotropically etching in a sulfur hexafluoride plasma with a power of 100 watts or less: to remove portions of the semiconductor substrate or the epitaxial layer to a depth of about 200 Å beneath the opening in the nitride layer; and to undercut the nitride layer, thereby exposing a portion of the substrate or the epitaxial layer beneath the nitride layer;

anisotropically etching in a chlorine plasma with a power of about 600 watts to about 800 watts at a pressure of about 0.2 Torr or less to remove portions of the semiconductor substrate or the epitaxial layer to form a trench opening having an internal surface and vertically sloping sides; and forming a thin oxide liner by oxidation by heating to a temperature of about 900° C. or less at the internal surface of the trench opening, at the vertically sloping sides, and at the exposed portion of the substrate or the epitaxial layer.

40. The method of claim 39, wherein the thin oxide liner is formed by oxidation at a temperature of about 800° C. to about 850° C.

41. The method of claim 40, wherein the thin oxide liner is formed by oxidation with water vapor as an oxidizing species.

* * * * *